US011116120B2

(12) United States Patent
Chi et al.

(10) Patent No.: US 11,116,120 B2
(45) Date of Patent: Sep. 7, 2021

(54) POSITIONING MODULE AND ELECTRONIC DEVICE

(71) Applicants: Cheng-Ya Chi, Taipei (TW); Ken-Ping Lin, Taipei (TW); Chien-Chu Chen, Taipei (TW); Han-Hsuan Tsai, Taipei (TW); Yao-Lin Chang, Taipei (TW); Ching-Tai Chang, Taipei (TW); Jui-Min Huang, Taipei (TW)

(72) Inventors: Cheng-Ya Chi, Taipei (TW); Ken-Ping Lin, Taipei (TW); Chien-Chu Chen, Taipei (TW); Han-Hsuan Tsai, Taipei (TW); Yao-Lin Chang, Taipei (TW); Ching-Tai Chang, Taipei (TW); Jui-Min Huang, Taipei (TW)

(73) Assignee: COMPAL ELECTRONICS, INC., Taipei (TW)

(*) Notice: Subject to any disclaimer, the term of this patent is extended or adjusted under 35 U.S.C. 154(b) by 19 days.

(21) Appl. No.: 16/810,863

(22) Filed: Mar. 6, 2020

(65) Prior Publication Data
US 2020/0288609 A1 Sep. 10, 2020

Related U.S. Application Data

(60) Provisional application No. 62/815,363, filed on Mar. 8, 2019.

(51) Int. Cl.
*H01R 13/62* (2006.01)
*H05K 13/04* (2006.01)

(52) U.S. Cl.
CPC ..... *H05K 13/0408* (2013.01); *H01R 13/6205* (2013.01); *H05K 13/0413* (2013.01); *G06F 2200/1632* (2013.01)

(58) Field of Classification Search
CPC .......... H01R 13/6205; H01R 13/62938; H01R 13/62955; B61G 3/00; H05K 13/0408;
(Continued)

(56) References Cited

U.S. PATENT DOCUMENTS 7,311,526 B2 * 12/2007 Rohrbach ................ G06F 1/18
439/39
7,431,598 B2 * 10/2008 Ikeya ............... H01R 13/62938
439/160
(Continued)

FOREIGN PATENT DOCUMENTS

CN 1617062 5/2005
TW I655562 4/2019

OTHER PUBLICATIONS

"Office Action of China Counterpart Application", dated May 24, 2021, pp. 1-8.

*Primary Examiner* — Bryan Earles
(74) *Attorney, Agent, or Firm* — JCIPRNET

(57) ABSTRACT

A positioning module includes a positioning element, an arc-shaped guiding unit, an actuating element, and a magnetic element. The positioning element is rotatably disposed at an object. The arc-shaped guiding unit is disposed between the positioning element and the object and is configured to enable the positioning element to rotate on an arc center of the arc-shaped guiding unit. The actuating element is connected to the positioning element and is configured to drive the positioning element. The magnetic element is disposed at another object and is configured to drive the actuating element. An engaging surface of the object is connected to another engaging surface of the another object, and a position of the actuating element corresponds to the magnetic element, so that a portion of the positioning element extends into another accommodation
(Continued)

space of the another object. An electronic device having the positioning module is further provided.

38 Claims, 7 Drawing Sheets

(58) Field of Classification Search
CPC .............. H05K 13/0413; H05K 5/0021; G06F 2200/1632; G06F 1/1613; G06F 1/1632; F16B 21/02; F16B 2001/0064
See application file for complete search history.

(56) References Cited

U.S. PATENT DOCUMENTS

| | | | |
|---|---|---|---|
| 9,239,595 B2* | 1/2016 | Liang | G06F 1/1654 |
| 9,954,314 B2* | 4/2018 | Mozer | H01R 13/62905 |
| 10,802,617 B2* | 10/2020 | Lin | G06F 1/169 |

* cited by examiner

POSITIONING MODULE AND ELECTRONIC DEVICE

CROSS-REFERENCE TO RELATED APPLICATION

This application claims the priority benefit of U.S. provisional application Ser. No. 62/815,363, filed on Mar. 8, 2019. The entirety of the above-mentioned patent application is hereby incorporated by reference herein and made a part of this specification.

BACKGROUND

Technical Field

The disclosure relates to a positioning module and an electronic device, and more particularly, to a positioning module and an electronic device having the positioning module.

Description of Related Art

In general, in order to allow two objects to be selectively combined together, methods such as magnetic attraction or hook engagement may be adopted. In the magnetic attraction method, two objects combined by magnetic attraction may easily drop due to collision, and if the object is small-sized, the dropped small object is also likely to be lost. In the hook engagement method, it is required to additionally make holes on respective surfaces of the two objects, or it is even required to provide a structure which protrudes from the appearance. Therefore, the insufficient temporary binding force between the two objects and the lack of aesthetics in appearance have become important issues in this field.

SUMMARY

The disclosure provides a positioning module and an electronic device, which can solve the issues of insufficient temporary binding force between two objects and the lack of aesthetics in appearance.

A positioning module of the disclosure includes a positioning element, an arc-shaped guiding unit, an actuating element, and a magnetic element. The positioning element is rotatably disposed at an object. The arc-shaped guiding unit is disposed between the positioning element and the object and is configured to enable the positioning element to rotate on an arc center of the arc-shaped guiding unit. The actuating element is connected to the positioning element and is configured to drive the positioning element. The magnetic element is disposed at another object and is configured to drive the actuating element. An engaging surface of the object is connected to another engaging surface of the another object, and a position of the actuating element corresponds to the magnetic element, so that a portion of the positioning element extends into another accommodation space of the another object.

An electronic device of the disclosure includes a positioning module, an object, and another object. The object and the another object may be selectively combined with each other via the positioning module.

In an embodiment of the disclosure, a positioning surface of the positioning element is inclined with respect to the engaging surface.

In an embodiment of the disclosure, the actuating element is a magnetically permeable element.

In an embodiment of the disclosure, the actuating element is a magnetic element.

In an embodiment of the disclosure, the arc-shaped guiding unit includes a first guiding part and a second guiding part. The first guiding part is disposed at the positioning element. The second guiding part is disposed at the object and is coupled to the first guiding part.

In an embodiment of the disclosure, the first guiding part includes a first end and a second end opposite to each other, and the second guiding part includes a third end and a fourth end opposite to each other. When the first end abuts against the third end, a portion of the positioning element extends into the another accommodation space. When the second end abuts against the fourth end, the positioning element is located in an accommodation space of the object.

In an embodiment of the disclosure, one of the first guiding part and the second guiding part includes a guiding block, and the other of the first guiding part and the second guiding part includes a guiding slot. The guiding block extends into the guiding slot.

In an embodiment of the disclosure, one of the first guiding part and the second guiding part includes two guiding columns, and the other of the first guiding part and the second guiding part includes a guiding slot. The two guiding columns extend into the guiding slot.

In an embodiment of the disclosure, the positioning module further includes a restoring element. The restoring element is disposed in the object and is configured to drive the actuating element.

In an embodiment of the disclosure, the restoring element is a magnetic element.

In an embodiment of the disclosure, the restoring element is an elastic element, and the restoring element is connected to the actuating element to drive the actuating element.

In an embodiment of the disclosure, an action force provided by the magnetic element to the actuating element is greater than an action force provided by the restoring element to the actuating element.

In an embodiment of the disclosure, the engaging surface and the another engaging surface are separated from each other, and a position of the actuating element corresponds to the restoring element, so that the positioning element is located in an accommodation space of the object.

In an embodiment of the disclosure, a positioning surface of the positioning element is parallel to the engaging surface.

In an embodiment of the disclosure, the positioning module further includes another positioning element, another arc-shaped guiding unit, another actuating element, and another magnetic element. The another positioning element is rotatably disposed at the another object. The another arc-shaped guiding unit is disposed between the another positioning element and the another object and is configured to enable the another positioning element to rotate on an arc center of the another arc-shaped guiding unit. The another actuating element is connected to the another positioning element and is configured to drive the another positioning element. The another magnetic element is disposed at the object and is configured to drive the another actuating element. The engaging surface is connected to the another engaging surface, and a position of the another actuating element corresponds to the another magnetic element, so that a portion of the another positioning element extends into an accommodation space of the object.

In an embodiment of the disclosure, a positioning surface of the positioning element is connected to another positioning surface of the another positioning element.

In an embodiment of the disclosure, the arc center of the arc-shaped guiding unit and the arc center of the another arc-shaped guiding unit are overlapped with each other.

In an embodiment of the disclosure, the object is a touch stylus, and the another object is a tablet computer.

In an embodiment of the disclosure, the object is a touch stylus, and the another object is a notebook computer.

In an embodiment of the disclosure, the object is a tablet computer, and the another object is an expansion base.

In an embodiment of the disclosure, the electronic device further includes a charging module. The charging module is disposed between the object and the another object and is configured to electrically connect the object and the another object.

Based on the above, the positioning module and the electronic device of the disclosure have a beautiful appearance and can improve the temporary binding force between two objects, which help prevent the two objects from dropping due to collision.

To make the aforementioned features and advantages of the disclosure more comprehensible, several embodiments accompanied with drawings are described in detail as follows.

DESCRIPTION OF THE EMBODIMENTS

Figure 1:
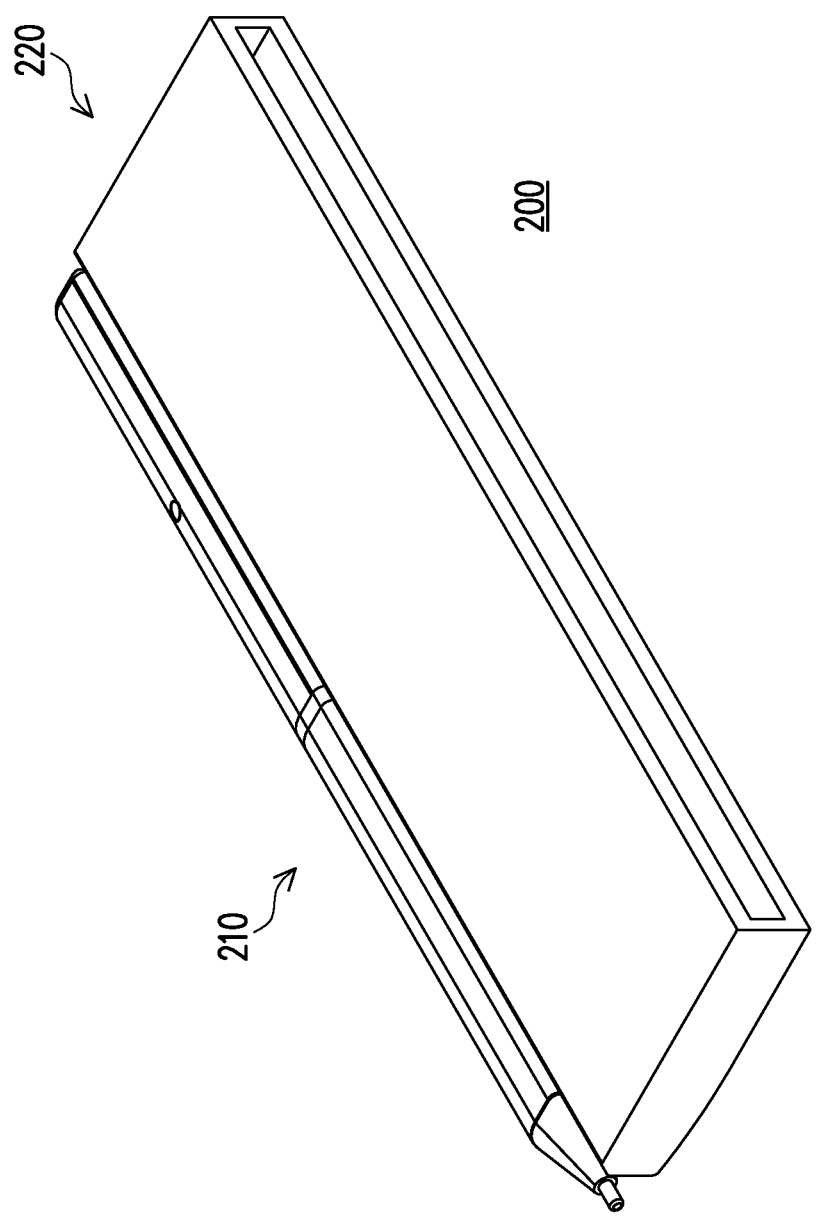
FIG. 1 is a perspective view showing an electronic device according to an embodiment of the disclosure.
Figure 2:
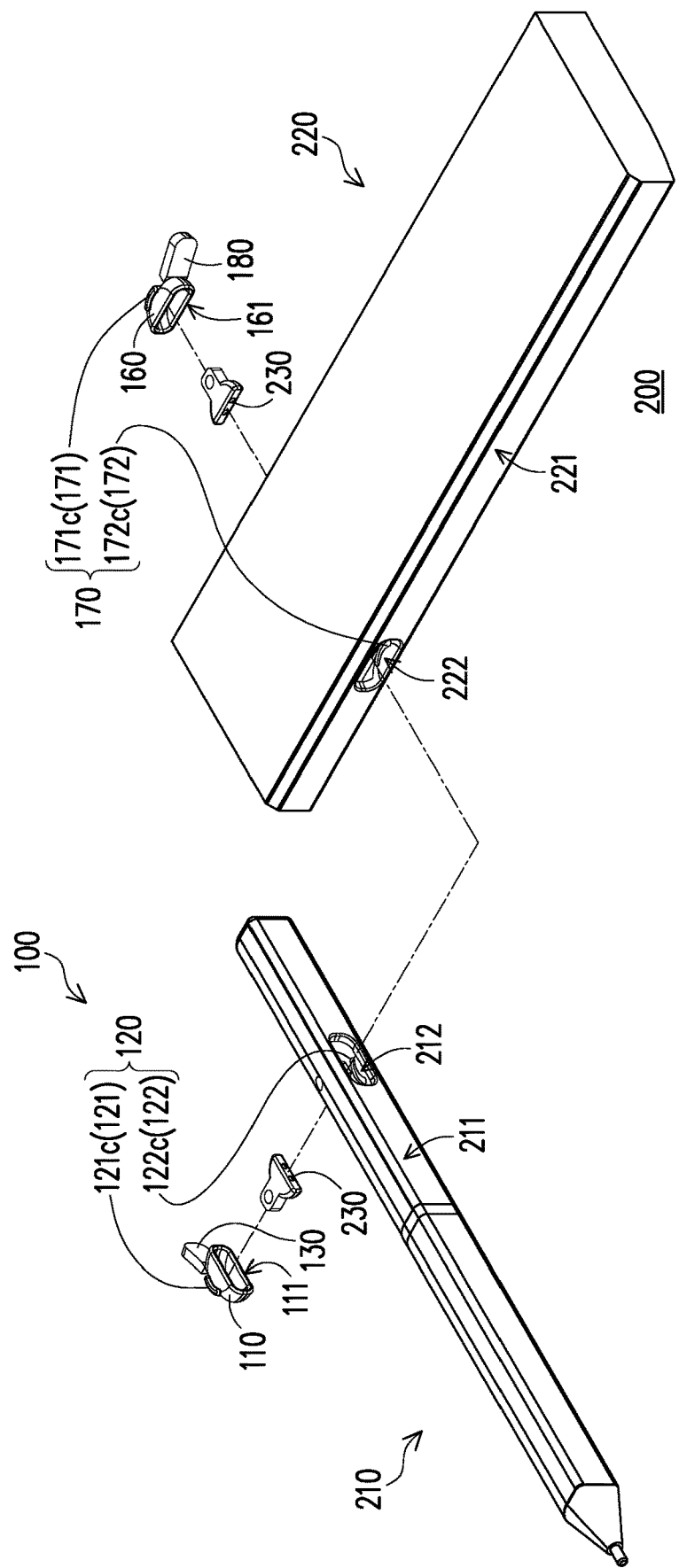
FIG. 2 is an exploded view showing the electronic device of FIG. 1.
Figure 3:
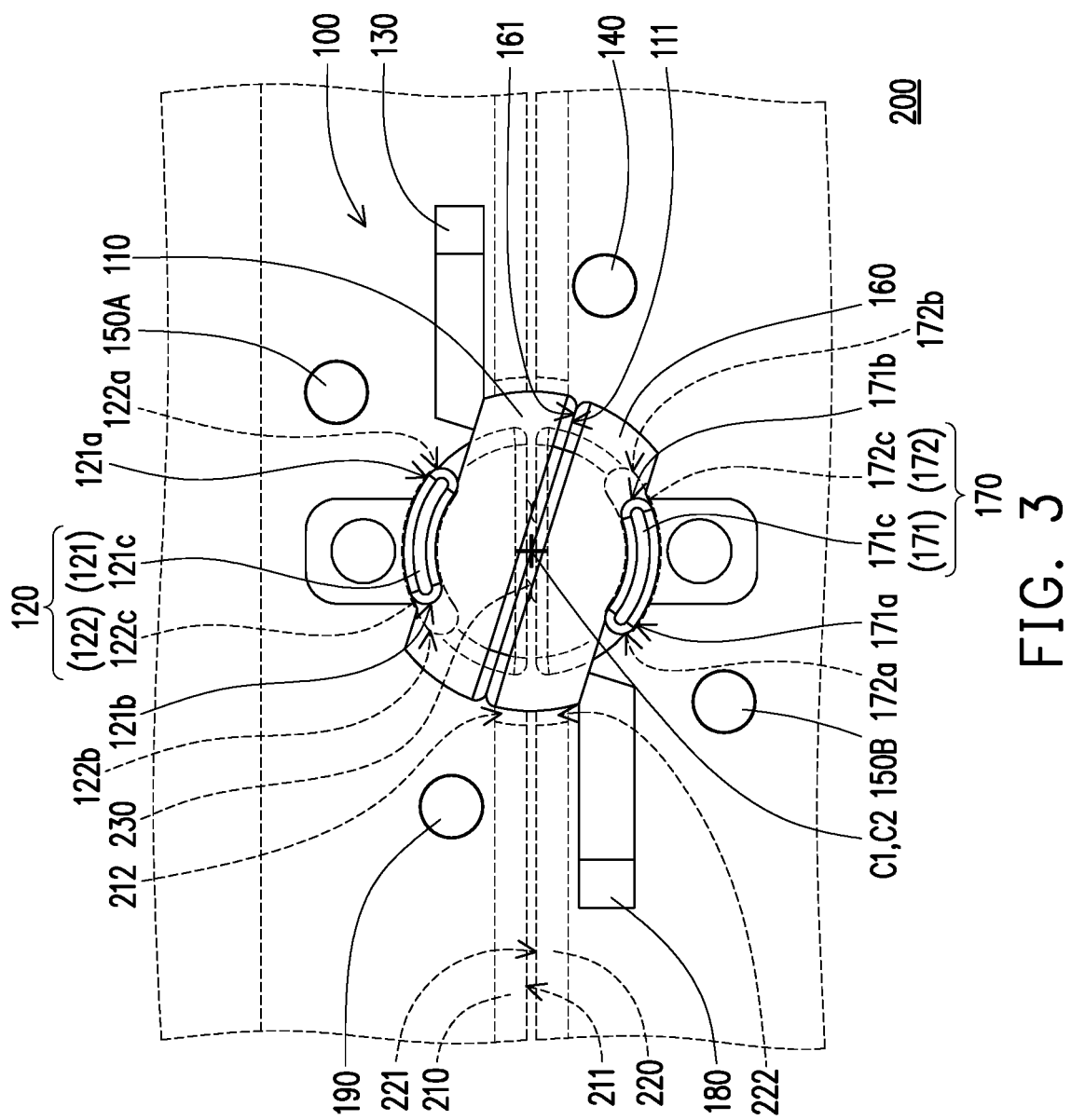
FIG. 3 is a schematic view showing a first object and a second object of the electronic device of FIG. 1 combined with each other.
Figure 4:
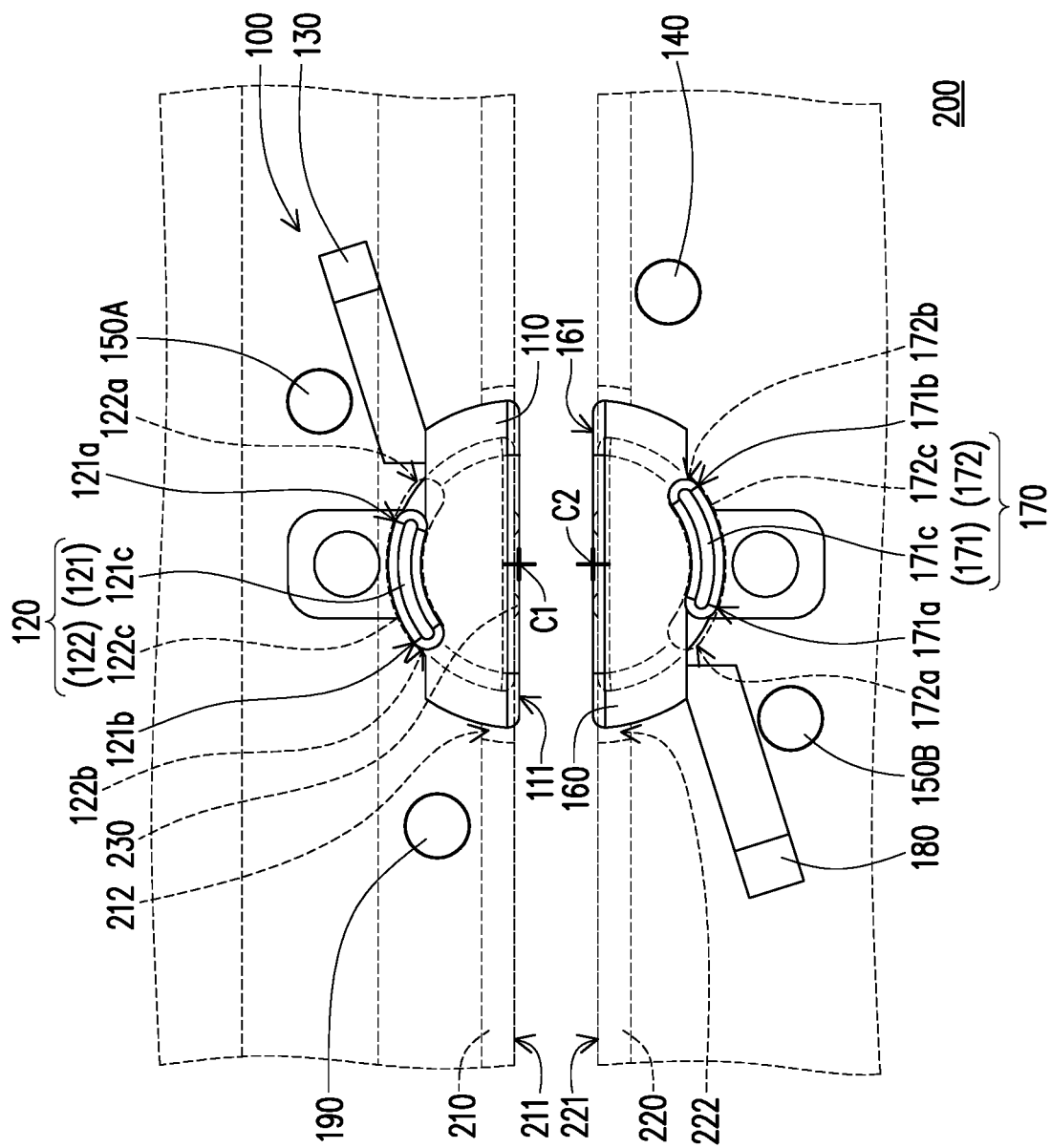
FIG. 4 is a schematic view showing the first object and the second object of the electronic device of FIG. 1 separated from each other.

FIG. 1 is a perspective view showing an electronic device according to an embodiment of the disclosure. FIG. 2 is an exploded view showing the electronic device of FIG. 1. FIG. 3 is a schematic view showing a first object and a second object of the electronic device of FIG. 1 combined with each other. FIG. 4 is a schematic view showing the first object and the second object of the electronic device of FIG. 1 separated from each other. For clarity and ease of description, part of the structure of an electronic device 200 is rendered in broken lines in FIG. 3 and FIG. 4, and lines which may cause interference are appropriately omitted. Referring to FIG. 1, FIG. 2, FIG. 3, and FIG. 4, the electronic device 200 of this embodiment includes a positioning module 100, an object (for example, but not limited to, a first object 210), and another object (for example, but not limited to, a second object 220). The first object 210 and the second object 220 are selectively combined with each other via the positioning module 100. In this embodiment, the first object 210 and the second object 220 are, for example, but not limited to, a combination of a touch stylus and a tablet computer. In other embodiments, the first object and the second object are, for example, but not limited to, a combination of a touch stylus and a notebook computer, or a tablet computer and an expansion base.

Specifically, the positioning module 100 includes a positioning element 110, an arc-shaped guiding unit 120, an actuating element 130, and a magnetic element 140. The positioning element 110 is rotatably disposed at the first object 210. The arc-shaped guiding unit 120 is disposed between the positioning element 110 and the first object 210, and the arc-shaped guiding unit 120 is configured to enable the positioning element 110 to rotate on an arc center C1 of the arc-shaped guiding unit 120. The actuating element 130 is connected to the positioning element 110, and the actuating element 130 is configured to drive the positioning element 110. The magnetic element 140 is disposed at the second object 220, and the magnetic element 140 is configured to drive the actuating element 130.

It is noted that the number of the arc-shaped guiding units 120 in this embodiment may be two. The two arc-shaped guiding units 120 are, for example, but not limited to, located on two opposite sides of the positioning element 110. For conciseness of description, only one of the arc-shaped guiding units 120 will be described below.

The first object 210 has an engaging surface (for example, but not limited to, a first engaging surface 211) and an accommodation space (for example, but not limited to, a first accommodation space 212). The second object 220 has another engaging surface (for example, but not limited to, a second engaging surface 221) and another accommodation space (for example, but not limited to, a second accommodation space 222). When the first engaging surface 211 of the first object 210 and the second engaging surface 221 of the second object 220 are connected to each other as shown in FIG. 3, the position of the actuating element 130 corresponds to the magnetic element 140, so that a portion of the positioning element 110 extends into the second accommodation space 222 of the second object 220. Accordingly, the positioning element 110 can provide additional lateral force, which helps prevent the first object 210 from being dropped or even lost due to collision.

On the other hand, in this embodiment, the same structure may be provided on the second object 220 to further strengthen the binding force between the first object 210 and the second object 220.

Specifically, the positioning module 100 further includes another positioning element (hereinafter referred to as a positioning element 160 for conciseness of description), another arc-shaped guiding unit (hereinafter referred to as an arc-shaped guiding unit 170 for conciseness of description), another actuating element (hereinafter referred to as an actuating element 180 for conciseness of description), and another magnetic element (hereinafter referred to as a magnetic element 190 for conciseness of description). The positioning element 160 is rotatably disposed at the second object 220. The arc-shaped guiding unit 170 is disposed between the positioning element 160 and the second object 220, and the arc-shaped guiding unit 170 is configured to enable the positioning element 160 to rotate on an arc center C2 of the arc-shaped guiding unit 170. The actuating element 180 is connected to the positioning element 160, and the actuating element 180 is configured to drive the positioning element 160. The magnetic element 190 is disposed at the first object 210, and the magnetic element 190 is configured to drive the actuating element 180.

It is noted that the number of the arc-shaped guiding units 170 in this embodiment may be two. The two arc-shaped guiding units 170 are, for example, but not limited to, located on two opposite sides of the positioning element 160. For conciseness of description, only one of the arc-shaped guiding units 170 will be described below.

When the first engaging surface 211 of the first object 210 and the second engaging surface 221 of the second object 220 are connected to each other as shown in FIG. 3, the position of the actuating element 180 corresponds to the magnetic element 190, so that a portion of the positioning element 160 extends into the first accommodation space 212 of the first object 210. Accordingly, the positioning element 160 can provide additional lateral force, which helps prevent the first object 210 from being dropped or even lost due to collision.

In this embodiment, the actuating element 130 and the actuating element 180 include, but are not limited to, magnetically permeable elements. In other embodiments, the two actuating elements include, but are not limited to, magnetic elements. In other embodiments, one of the two actuating elements includes, but is not limited to, a magnetically permeable element, and the other of the two actuating elements includes, but is not limited to, a magnetic element.

Referring to FIG. 1, FIG. 2, and FIG. 3, the arc-shaped guiding unit 120 includes a first guiding part 121 and a second guiding part 122. The first guiding part 121 is disposed at the positioning element 110. The second guiding part 122 is disposed at the first object 210. The first guiding part 121 and the second guiding part 122 are coupled to each other.

Specifically, the first guiding part 121 includes, but is not limited to, a guiding block 121c, a first end 121a, and a second end 121b opposite to the first end 121a. The second guiding part 122 includes, but is not limited to, a guiding slot 122c, a third end 122a, and a fourth end 122b opposite the third end 122a. The guiding block 121c extends into the guiding slot 122c, and the guiding block 121c may reciprocatingly slide in the guiding slot 122c. The guiding block 121c includes an arc-shaped capsule shape, an arc-shaped strip shape, etc., but is not limited to the above shapes. In other embodiments, the first guiding part includes, but is not limited to, a guiding slot, and the second guiding part includes, but is not limited to, a guiding block.

On the other hand, the arc-shaped guiding unit 170 includes a first guiding part 171 and a second guiding part 172. The first guiding part 171 is disposed at the positioning element 160. The second guiding part 172 is disposed at the second object 220. The first guiding part 171 and the second guiding part 172 are coupled to each other.

Specifically, the first guiding part 171 includes, but is not limited to, a guiding block 171c, a first end 171a, and a second end 171b opposite to the first end 171a. The second guiding part 172 includes, but is not limited to, a guiding slot 172c, a third end 172a, and a fourth end 172b opposite the third end 172a. The guiding block 171c extends into the guiding slot 172c, and the guiding block 171c may reciprocatingly slide in the guiding slot 172c. The guiding block 171c includes an arc-shaped capsule shape, an arc-shaped strip shape, etc., but is not limited to the above shapes. In other embodiments, the first guiding part includes, but is not limited to, a guiding slot, and the second guiding part includes, but is not limited to, a guiding block.

Referring to FIG. 3 and FIG. 4, the positioning element 110 includes a positioning surface 111. The positioning element 160 includes another positioning surface (hereinafter referred to as a positioning surface 161 for conciseness of description). When the first engaging surface 211 is connected to the second engaging surface 221 as shown in FIG. 3, the magnetic element 140 attracts the actuating element 130 by magnetic force, and the magnetic element 190 attracts the actuating element 180 by magnetic force. At this time, the positioning surface 111 is connected to the positioning surface 161, and both the positioning surface 111 and the positioning surface 161 are inclined with respect to the first engaging surface 211. In other words, neither the positioning surface 111 nor the positioning surface 161 is parallel to the first engaging surface 211.

In addition, when the first engaging surface 211 is connected to the second engaging surface 221 as shown in FIG. 3, the first end 121a abuts against the third end 122a, and the second end 121b abuts against the fourth end 122b. The first end 171a abuts against the third end 172a, and the second end 171b abuts against the fourth end 172b. The arc center C1 of the arc-shaped guiding unit 120 and the arc center C2 of the arc-shaped guiding unit 170 are overlapped with each other. In other words, when the first engaging surface 211 is connected to the second engaging surface 221 as shown in FIG. 3, the arc-shaped guiding unit 120 and the arc-shaped guiding unit 170 are coaxial.

Referring to FIG. 1, FIG. 2, and FIG. 4, the positioning module 100 further includes restoring elements (for example, but not limited to, a restoring element 150A and a restoring element 150B). The restoring element 150A is disposed in the first object 210, and the restoring element 150A is configured to drive the actuating element 130. The restoring element 150B is disposed in the second object 220, and the restoring element 150B is configured to drive the actuating element 180.

In this embodiment, the restoring element 150A and the restoring element 150B include, but are not limited to, magnetic elements. In other embodiments, the two restoring elements are elastic elements, which include, but are not limited to, springs and may also be made of other elastic materials having stretch and recovery capabilities. Moreover, the restoring element is connected to the actuating element to drive the actuating element. In other embodiments, one of the two restoring elements includes, but is not limited to, a magnetic element, and the other of the two restoring elements includes, but is not limited to, an elastic element.

When the first engaging surface 211 and the second engaging surface 221 are separated from each other, the position of the actuating element 130 corresponds to the restoring element 150A, so that the positioning element 110 is moved out of the second accommodation space 222 and is moved into the first accommodation space 212. The position of the actuating element 180 corresponds to the restoring element 150B, so that the positioning element 160 is moved out of the first accommodation space 212 and is moved into the second accommodation space 222.

At this time, the positioning surface 111 and the positioning surface 161 are separated from each other. The positioning surface 111 is parallel to the first engaging surface 211, and the positioning surface 161 is parallel to the second engaging surface 221.

With the above structure, when the first object 210 and the second object 220 are moved from the separated state shown in FIG. 4 to the close state shown in FIG. 3, the first engaging surface 211 and the second engaging surface 221 abut against each other. When the positioning element 110 and the positioning element 160 correspond to each other in position, the magnetic element 140 can magnetically attract the actuating element 130, so that a portion of the positioning element 110 is automatically rotated into the second accommodation space 222 to provide lateral engaging force. The magnetic element 190 can magnetically attract the actuating element 180, so that a portion of the positioning element 160 is automatically rotated into the first accommodation space 212 to provide lateral engaging force. It is noted that, in order to enable the magnetic element 140 to magnetically attract the actuating element 130 so that the positioning element 110 is automatically rotated and enable the magnetic element 190 to magnetically attract the actuating element 180 so that the positioning element 160 is automatically rotated, the magnetic element 140 preferably provides an action force greater than that of the restoring element 150A, and the magnetic element 190 preferably provides an action force greater than that of the restoring element 150B.

Conversely, when the first object 210 and the second object 220 are moved from the close state shown in FIG. 3 to the separated state shown in FIG. 4, since the attraction applied by the magnetic element 140 to the actuating element 130 disappears, and the attraction applied by the magnetic element 190 to the actuating element 180 disappears, the restoring element 150A will drive the actuating element 130 to move the positioning element 110 into the first accommodation space 212, and the restoring element 150B will drive the actuating element 180 to move the positioning element 160 into the second accommodation space 222. Accordingly, the positioning element 110 is automatically rotated and received in the first accommodation space 212, and the positioning element 160 is automatically rotated and received in the second accommodation space 222, which helps create a flat appearance of the first object 210 and the second object 220.

In addition, in order to provide an electrical connection function between the first object 210 and the second object 220, the electronic device 200 may further include a charging module 230. The charging module 230 is, for example, but not limited to, a pogo pin and is disposed between the first object 210 and the second object 220 to provide the electrical connection function between the first object 210 and the second object 220.

Figure 5:
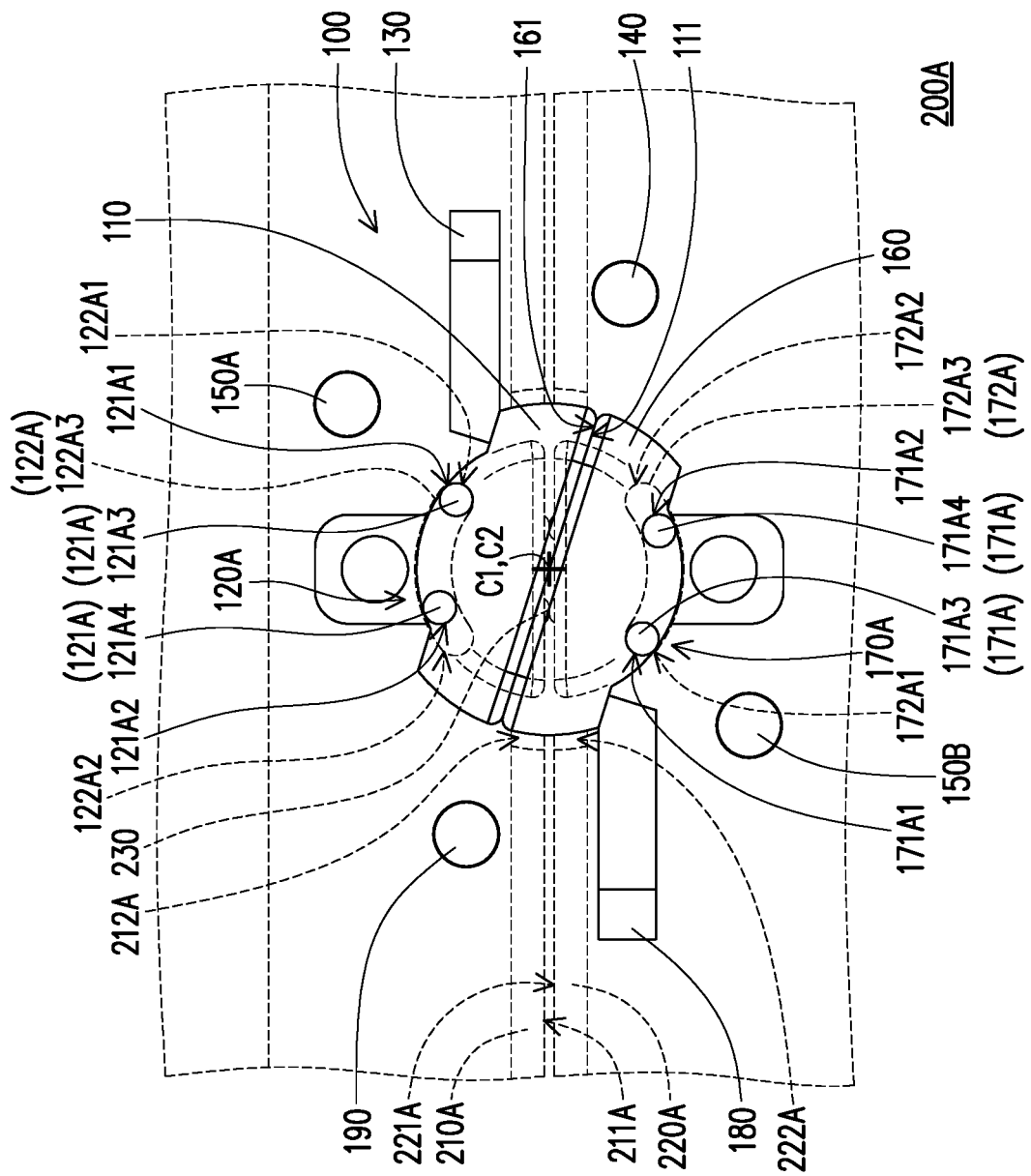
FIG. 5 is a schematic view showing an electronic device according to another embodiment of the disclosure, in which a first object and a second object are combined with each other.
Figure 6:
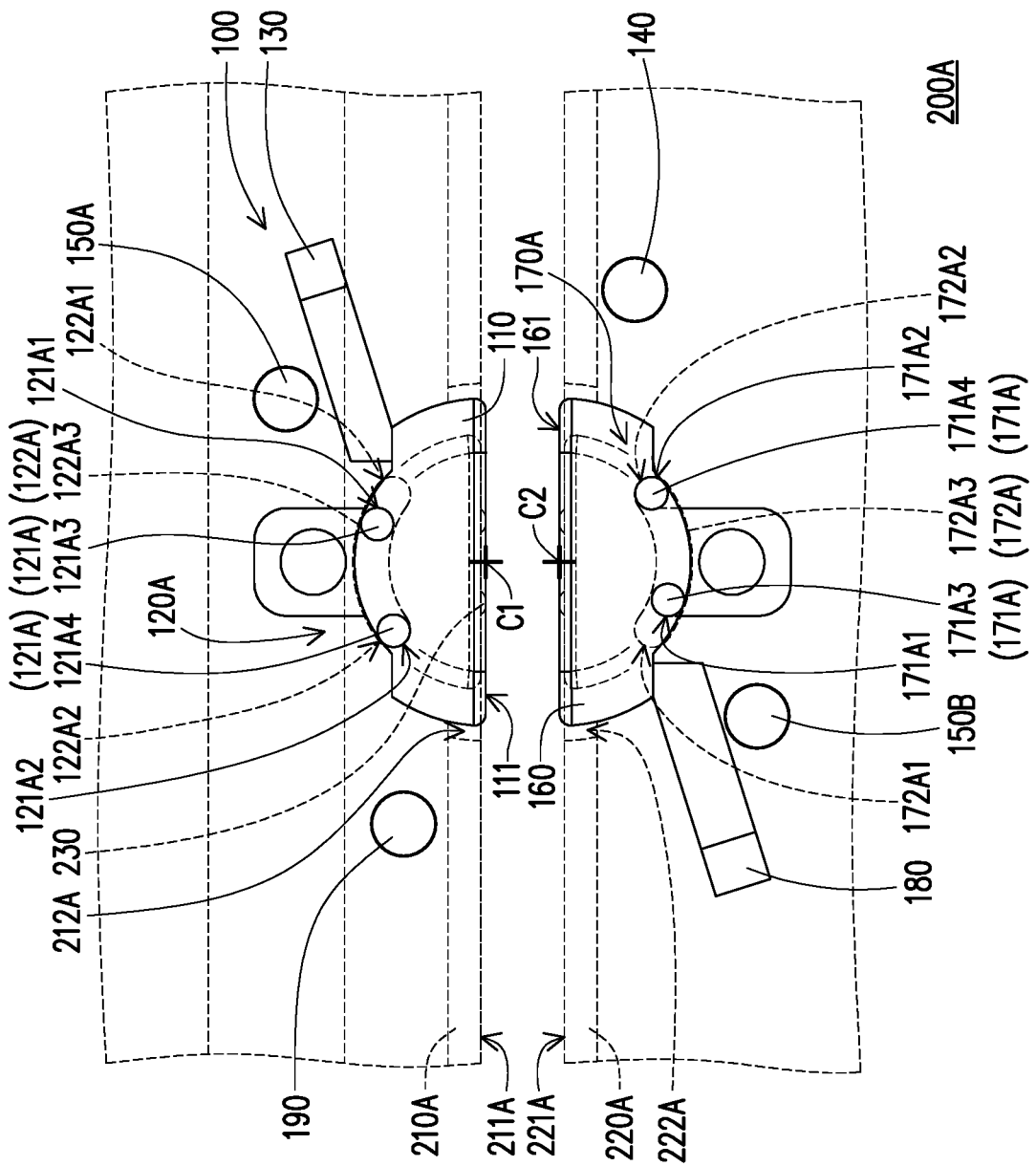
FIG. 6 is a schematic view showing the first object and the second object of the electronic device of FIG. 5 separated from each other.

FIG. 5 is a schematic view showing an electronic device according to another embodiment of the disclosure, in which a first object and a second object are combined with each other. FIG. 6 is a schematic view showing the first object and the second object of the electronic device of FIG. 5 separated from each other. Referring to FIG. 5 and FIG. 6, an electronic device 200A in this embodiment includes a first object 210A and a second object 220A, and a first object 210A. The main difference between the electronic device 200A in this embodiment and the electronic device 200 in the embodiment shown in FIG. 3 lies in that, in the electronic device 200A of this embodiment, an arc-shaped guiding unit 120A includes a first guiding part 121A and a second guiding part 122A. The first guiding part 121A includes a guiding column 121A3 and a guiding column 121A4. The guiding column 121A3 and the guiding column 121A4 include circular columns, hemispheres, square columns, etc., but are not limited to the above shapes. The second guiding part 122A includes a guiding slot 122A3. The guiding column 121A3 and the guiding column 121A4 extend into the guiding slot 122A3. An arc-shaped guiding unit 170A includes a first guiding part 171A and a second guiding part 172A. The first guiding part 171A includes a guiding column 171A3 and a guiding column 171A4. The guiding column 171A3 and the guiding column 171A4 include circular columns, hemispheres, square columns, etc., but are not limited to the above shapes. The second guiding part 172A includes a guiding slot 172A3. The guiding column 171A3 and the guiding column 171A4 extend into the guiding slot 172A3.

When a first engaging surface 211A of the first object 210A and a second engaging surface 221A of the second object 220A abut against each other, the guiding column 121A3 serving as a first end 121A1 abuts against a third end 122A1 of the second guiding part 122A, and the guiding column 171A3 serving as a first end 171A1 abuts against a third end 172A1 of the second guiding part 172A. Conversely, when the first engaging surface 211A of the first object 210A and the second engaging surface 221A of the second object 220A are separated from each other, the guiding column 121A4 serving as a second end 121A2 abuts against a fourth end 122A2 of the second guiding part 122A, and the guiding column 171A4 serving as a second end 171A2 abuts against a fourth end 172A2 of the second guiding part 172A.

Figure 7:
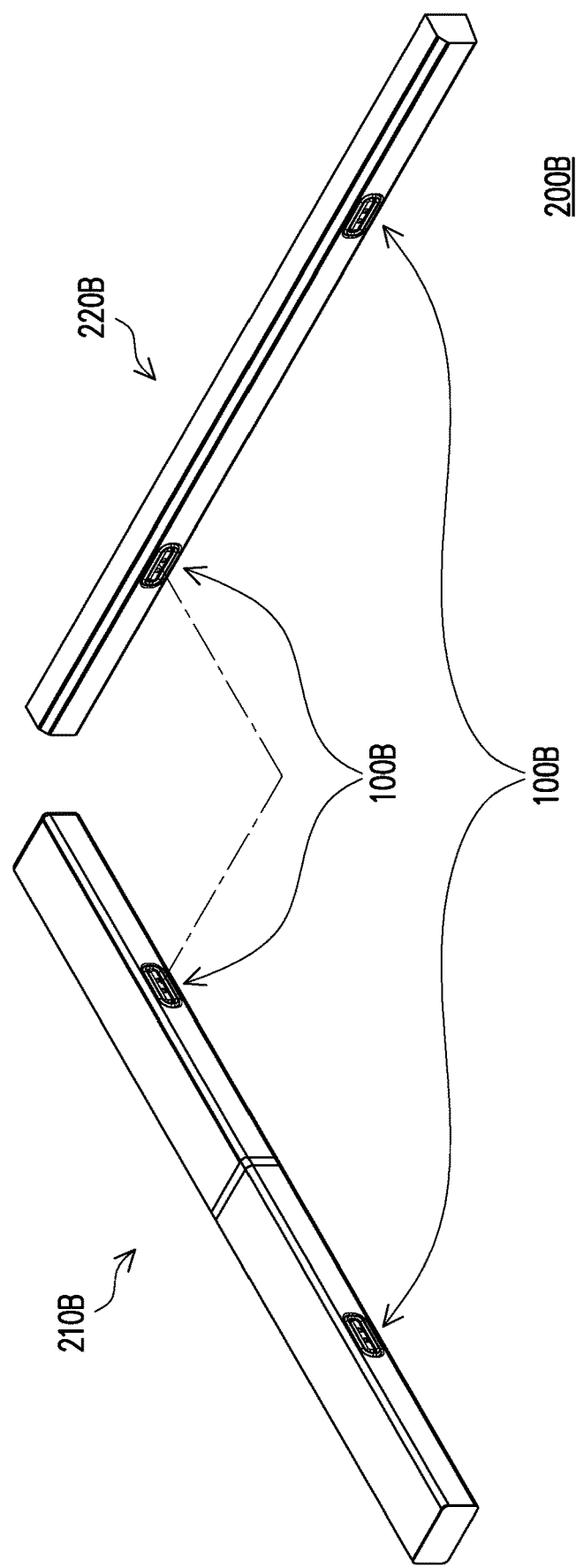
FIG. 7 is a schematic view showing an electronic device according to still another embodiment of the disclosure.

FIG. 7 is a schematic view showing an electronic device according to still another embodiment of the disclosure. Referring to FIG. 7, an electronic device 200B in this embodiment includes a first object 210B, a second object 220B, and a positioning module 100B. The first object 210B may be selectively combined with the second object 220B via the positioning module 100B. The first object 210B is, for example, but not limited to, a tablet computer, and the second object 220B is, for example, but not limited to, an expansion base. In other words, the electronic device 200B may be a 2-in-1 notebook computer.

In summary of the above, in the positioning module and the electronic device of the disclosure, when an engaging surface of an object is connected to another engaging surface of another object, and the position of the actuating element corresponds to the magnetic element, a portion of the positioning element may extend into another accommodation space of the another object, so that the positioning element can provide additional lateral force, which helps prevent the object or the another object from being dropped or even lost due to collision.

In addition, when an engaging surface of an object and another engaging surface of another object are separated from each other, and the position of the actuating element corresponds to the restoring element, the positioning element may be received in the accommodation space, which helps create a flat appearance of the object and the another object.

Although the disclosure has been disclosed as the embodiments above, the embodiments are not meant to limit the disclosure. Any person skilled in the art may make slight modifications and variations without departing from the spirit and scope of the disclosure. Therefore, the protection scope of the disclosure shall be defined by the claims attached below.

What is claimed is:

1. A positioning module comprising:
   a positioning element rotatably disposed at an object;
   an arc-shaped guiding unit disposed between the positioning element and the object and configured to enable the positioning element to rotate on an arc center of the arc-shaped guiding unit;
   an actuating element connected to the positioning element and configured to drive the positioning element; and a magnetic element disposed at another object and configured to drive the actuating element, wherein an engaging surface of the object is connected to another engaging surface of the another object, and a position of the actuating element corresponds to the magnetic element, so that a portion of the positioning element extends into another accommodation space of the another object.

2. The positioning module according to claim 1, wherein a positioning surface of the positioning element is inclined with respect to the engaging surface.

3. The positioning module according to claim 1, wherein the actuating element is a magnetically permeable element.

4. The positioning module according to claim 1, wherein the actuating element is a magnetic element.

5. The positioning module according to claim 1, wherein the arc-shaped guiding unit comprises:
   a first guiding part disposed at the positioning element; and
   a second guiding part disposed at the object and coupled to the first guiding part.

6. The positioning module according to claim 5, wherein the first guiding part comprises a first end and a second end opposite to each other, and the second guiding part comprises a third end and a fourth end opposite to each other, wherein the first end abuts against the third end, and a portion of the positioning element extends into the another accommodation space, wherein the second end abuts against the fourth end, and the positioning element is located in an accommodation space of the object.

7. The positioning module according to claim 5, wherein one of the first guiding part and the second guiding part comprises a guiding block, the other of the first guiding part and the second guiding part comprises a guiding slot, and the guiding block extends into the guiding slot.

8. The positioning module according to claim 5, wherein one of the first guiding part and the second guiding part comprises two guiding columns, the other of the first guiding part and the second guiding part comprises a guiding slot, and the two guiding columns extend into the guiding slot.

9. The positioning module according to claim 1, further comprising:
   a restoring element disposed in the object and configured to drive the actuating element.

10. The positioning module according to claim 9, wherein the restoring element is a magnetic element.

11. The positioning module according to claim 9, wherein the restoring element is an elastic element, and the restoring element is connected to the actuating element to drive the actuating element.

12. The positioning module according to claim 9, wherein an action force provided by the magnetic element to the actuating element is greater than an action force provided by the restoring element to the actuating element.

13. The positioning module according to claim 9, wherein the engaging surface and the another engaging surface are separated from each other, and a position of the actuating element corresponds to the restoring element, so that the positioning element is located in an accommodation space of the object.

14. The positioning module according to claim 13, wherein a positioning surface of the positioning element is parallel to the engaging surface.

15. The positioning module according to claim 1, further comprising:
   another positioning element rotatably disposed at the another object;
   another arc-shaped guiding unit disposed between the another positioning element and the another object and configured to enable the another positioning element to rotate on an arc center of the another arc-shaped guiding unit;
   another actuating element connected to the another positioning element and configured to drive the another positioning element; and
   another magnetic element disposed at the object and configured to drive the another actuating element,
   wherein the engaging surface is connected to the another engaging surface, and a position of the another actuating element corresponds to the another magnetic element, so that a portion of the another positioning element extends into an accommodation space of the object.

16. The positioning module according to claim 15, wherein a positioning surface of the positioning element is connected to another positioning surface of the another positioning element.

17. The positioning module according to claim 15, wherein the arc center of the arc-shaped guiding unit and the arc center of the another arc-shaped guiding unit are overlapped with each other.

18. An electronic device comprising:
   an object;
   another object; and
   a positioning module comprising:
      a positioning element rotatably disposed at the object;
      an arc-shaped guiding unit disposed between the positioning element and the object and configured to enable the positioning element to rotate on an arc center of the arc-shaped guiding unit;
      an actuating element connected to the positioning element and configured to drive the positioning element; and
      a magnetic element disposed at the another object and configured to drive the actuating element,
   wherein an engaging surface of the object is connected to another engaging surface of the another object, and a position of the actuating element corresponds to the magnetic element, so that a portion of the positioning element extends into another accommodation space of the another object, and the object and the another object are selectively combined with each other via the positioning module.

19. The electronic device according to claim 18, wherein the object is a touch stylus, and the another object is a tablet computer.

20. The electronic device according to claim 18, wherein the object is a touch stylus, and the another object is a notebook computer.

21. The electronic device according to claim 18, wherein the object is a tablet computer, and the another object is an expansion base.

22. The electronic device according to claim 18, further comprising:
   a charging module disposed between the object and the another object and configured to electrically connect the object and the another object.

23. The electronic device according to claim 18, wherein a positioning surface of the positioning element is inclined with respect to the engaging surface.

24. The electronic device according to claim 18, wherein the actuating element is a magnetically permeable element.

25. The electronic device according to claim 18, wherein the actuating element is a magnetic element.

26. The electronic device according to claim 18, wherein the arc-shaped guiding unit comprises:
   a first guiding part disposed at the positioning element; and
   a second guiding part disposed at the object and coupled to the first guiding part.

27. The electronic device according to claim 26, wherein the first guiding part comprises a first end and a second end opposite to each other, and the second guiding part comprises a third end and a fourth end opposite to each other, wherein the first end abuts against the third end, and a portion of the positioning element extends into the another accommodation space, wherein the second end abuts against the fourth end, and the positioning element is located in an accommodation space of the object.

28. The electronic device according to claim 26, wherein one of the first guiding part and the second guiding part comprises a guiding block, the other of the first guiding part and the second guiding part comprises a guiding slot, and the guiding block extends into the guiding slot.

29. The electronic device according to claim 26, wherein one of the first guiding part and the second guiding part comprises two guiding columns, the other of the first guiding part and the second guiding part comprises a guiding slot, and the two guiding columns extend into the guiding slot.

30. The electronic device according to claim 18, further comprising:
   a restoring element disposed in the object and configured to drive the actuating element.

31. The electronic device according to claim 30, wherein the restoring element is a magnetic element.

32. The electronic device according to claim 30, wherein the restoring element is an elastic element, and the restoring element is connected to the actuating element to drive the actuating element.

33. The electronic device according to claim 30, wherein an action force provided by the magnetic element to the actuating element is greater than an action force provided by the restoring element to the actuating element.

34. The electronic device according to claim 30, wherein the engaging surface and the another engaging surface are separated from each other, and a position of the actuating element corresponds to the restoring element, so that the positioning element is located in an accommodation space of the object.

35. The electronic device according to claim 34, wherein a positioning surface of the positioning element is parallel to the engaging surface.

36. The electronic device according to claim 18, further comprising:
   another positioning element rotatably disposed at the another object;
   another arc-shaped guiding unit disposed between the another positioning element and the another object and configured to enable the another positioning element to rotate on an arc center of the another arc-shaped guiding unit;
   another actuating element connected to the another positioning element and configured to drive the another positioning element; and
   another magnetic element disposed at the object and configured to drive the another actuating element,
   wherein the engaging surface is connected to the another engaging surface, and a position of the another actuating element corresponds to the another magnetic element, so that a portion of the another positioning element extends into an accommodation space of the object.

37. The electronic device according to claim 36, wherein a positioning surface of the positioning element is connected to another positioning surface of the another positioning element.

38. The electronic device according to claim 36, wherein the arc center of the arc-shaped guiding unit and the arc center of the another arc-shaped guiding unit are overlapped with each other.

* * * * *